United States Patent [19]
Vaartstra

[11] Patent Number: 6,095,161
[45] Date of Patent: Aug. 1, 2000

[54] PROCESSING AND POST-PROCESSING COMPOSITIONS AND METHODS OF USING SAME

[75] Inventor: Brian A. Vaartstra, Nampa, Id.

[73] Assignee: Micron Technology, Inc., Boise, Id.

[21] Appl. No.: 08/785,659

[22] Filed: Jan. 17, 1996

[51] Int. Cl.$^7$ ........................................................ C25F 3/30
[52] U.S. Cl. .......................... 134/1.3; 134/2; 252/79.1; 252/79.4
[58] Field of Search ...................... 134/1.3, 2; 252/79.1, 252/79.4

[56] References Cited

U.S. PATENT DOCUMENTS

| | | | |
|---|---|---|---|
| 2,857,331 | 10/1958 | Hollingsworth et al. | 252/61 |
| 3,953,381 | 4/1976 | Remond et al. | 252/544 |
| 5,076,955 | 12/1991 | Ussat et al. | |
| 5,271,861 | 12/1993 | Buchwald et al. | 252/153 |
| 5,399,281 | 3/1995 | Buchwald et al. | 252/153 |
| 5,463,456 | 10/1995 | Yashiki et al. | 355/299 |
| 5,498,293 | 3/1996 | Ilardi et al. | 134/3 |
| 5,575,885 | 11/1996 | Hirabayashi et al. | 156/626.1 |

FOREIGN PATENT DOCUMENTS

| | | |
|---|---|---|
| 217046 | 7/1984 | Czech Rep. . |
| 62-020596 | 1/1987 | Japan . |
| 62-025197 | 2/1987 | Japan . |
| 62-043482 | 2/1987 | Japan . |
| 3-074499 | 3/1991 | Japan . |
| 7-034095 | 2/1995 | Japan . |
| 7-249600 | 9/1995 | Japan . |
| 8-012998 | 1/1996 | Japan . |
| 1781271 | 12/1992 | U.S.S.R. . |
| 1806157 | 3/1993 | U.S.S.R. . |

OTHER PUBLICATIONS

H. Akiya et al., "Thin–Oxide Dielectric Strength Improvement by Adding a Phosphonic Acid Chelating Agent into $NH_4OH$—$H_2O_2$ Solution", *J. Electrochem. Soc.*, 141, 4 pgs. (1994).

P. Hidber et al., "Citric—A Dispersant for Aqueous Alumina Suspensions", *J. Am. Ceram. Soc.*, 79, 1857–1867 (1996).

*Primary Examiner*—William Powell
*Assistant Examiner*—George Goudreau
*Attorney, Agent, or Firm*—Mueting, Raasch & Gebhardt, P.A.

[57] ABSTRACT

A composition for use in processing and cleaning substrates includes a compound of the formula (I): $R^1$—$C(O)$—$NR^2$—$[(CR^3R^4)_x$—$N$—$R^5]_y$—$[C(O)]_z$—$R^6$, wherein each of $R^1$, $R^2$, $R^3$, $R^4$, $R^5$, and $R^6$ is independently H or an organic group, x=1–10, y=0–10, and z=0–1. The compound of Formula I is preparable by a condensation reaction of a carboxylic acid and an amine. A method of processing a substrate includes, for example, planarizing the substrate surface with a processing composition comprising a compound of Formula I. A method of cleaning a substrate and processing equipment after, for example, planarizing a substrate surface with an abrasive material includes cleaning the substrate surface and processing equipment with the cleaning composition.

45 Claims, 2 Drawing Sheets

Preparation of a processing composition → Planarization of a wafer using the processing composition and an abrasive pad Planarization Using Processing Composition Planarization Using Processing Composition Post-Planarization Wafer Cleaning

PROCESSING AND POST-PROCESSING COMPOSITIONS AND METHODS OF USING SAME

FIELD OF THE INVENTION

The present invention pertains to processing compositions and post-processing compositions and processing and post-processing methods using such compositions in the removal of contaminants from substrates and equipment. More particularly, the present invention is directed to the use of amide-containing compounds in processing and cleaning compositions and methods.

BACKGROUND OF THE INVENTION

A large fraction of yield losses in wafer fabrication or processing of semiconductor devices is attributed to contamination. Contaminants can be organic or inorganic particles, films or molecular compounds, ionic materials, or atomic species. Particularly problematic, however, is contamination from abrasive particles used during processing, such as, for example, planarization. For example, during chemical mechanical planarization or polishing (CMP), a rotating substrate of semiconductor material is held against a wetted planarization or polishing surface under controlled chemical liquid (i.e., slurry), pressure, and temperature conditions. The liquid typically consists of an abrasive component, such as alumina, silica, or similar particulates, although, alternatively, a pad could include the abrasive component. Once the planarization or polishing is complete, abrasive particles typically remain on the surface of the substrate.

Thus, the primary contaminants that need to be removed from the substrate surface during/after processing, such as planarization or polishing, and prior to subsequent processing steps are alumina, silica, and oxides. Other contaminants that can also be problematic include ionic, atomic, or molecular species containing sodium, potassium, lithium, calcium, boron, manganese, sodium, titanium, zirconium, magnesium, iron, copper, nickel, gold, silicon, and aluminum. Such contiminants may diffuse into the surface of the substrate and down fracture paths.

Also, the presence of contaminants during substrate processing has become particularly problematic in high density, large scale integration (LSI) technology. For example, contaminants can cause a device to fail by improperly defining patterns, creating unpredictable surface topography, inducing leakage currents through insulating layers, or accelerating device wearout.

It has been reported that phosphonic acid chelating agents added to a SC-1 wet cleaning solution (a mixture of $NH_4OH$, $H_2O_2$, and $H_2O$) of an RCA clean commonly used to remove particles and organic contaminants on silicon surfaces subsequent to planarization processing, reduces certain metallic contamination deposition on a silicon substrate. This conclusion was reached in the article entitled "Thin-Oxide Dielectric Strength Improvement by Adding a Phosphonic Acid Chelating Agent into $NH_4OH$—$H_2O_2$ Solution" by Akiya et al., *J.Electrochem. Soc.*, Vol.141, No. 10, October 1994. Also, it has been demonstrated that water soluble multidentate chelating agents, particularly water soluble bidentate ionic chelating agents, such as 1,2-ethylenediphosphonic acid (EDP), can be used during planarization processing to remove metal ion contaminants, as disclosed in U.S. patent application Ser. No. 08/682,308, filed on Jul. 17, 1996, entitled "A Planarization Fluid Composition Including Chelating Agents and Planarization Method Using Same."

Another problem that has not been adequately addressed is the cleaning of the planarization or polishing surface both during and after processing. When planarization or polishing surfaces are used with abrasive slurries, it is important to prevent the buildup of abrasive particulates and other contaminants on such polishing surfaces. When abrasive pads are used, it is important to prevent the buildup of metal and metalloid ions and oxides, for example, on such abrasive pads. Such contaminants shorten the effective lifetime of processing equipment and should be removed to ensure precise processing of substrates during planarization or polishing without excessive contamination of the substrates.

Thus, compositions and methods are still needed to reduce, for example, the amount of metal and metalloid ion and abrasive particulate contamination of, for example, the substrate being processed and the processing equipment used. The present invention as described below provides such compositions and methods.

SUMMARY OF THE INVENTION

The present invention provides compositions and methods for cleaning substrates and processing equipment both during and subsequent to processing, such as, for example, planarization or polishing processes. The compositions include an amide-containing compound of the following formula (Formula I): $R^1$—C(O)—$NR^2$—[$(CR^3R^4)_x$—N—$R^5]_y$—[C(O)]_z, —$R^6$, wherein each of $R^1$, $R^2$, $R^3$, $R^4$, $R^5$, and $R^6$ is independently H or an organic group, x=1–10, y=0–10, and z=0–1. Preferably, each of $R^1$, $R^2$, $R^3$, $R^4$, $R^5$, and $R^6$ is independently H or an organic group containing 1–30 carbon atoms, x=1–3, y=1–5, and z=0–1. More preferably, each of $R^1$, $R^2$, $R^3$, $R^4$, $R^5$, and $R^6$ is independently H or an organic group containing 1–20 carbon atoms. Most preferably, each of $R^1$ and $R^6$ is independently H or an organic group containing 10–20 carbon atoms and each of $R^2$, $R^3$, $R^4$, and $R^5$ is independently H or an organic group containing 1–5 carbon atoms. Such compositions may include a mixture of a compound of Formula I, the parent carboxylic acid, and/or the parent amine. In one embodiment, the composition of the invention is preparable by combining components comprising a carboxylic acid and an amine. In another embodiment, the amide-containing compounds are preferably preparable by a condensation reaction of a carboxylic acid and an amine.

The present invention also provides a method of processing a substrate surface. This method includes processing the substrate surface with a processing composition comprising an amide-containing compound of Formula I. For example, when processing a substrate surface using planarization or polishing, the processing composition can include an abrasive component, such as silica or alumina, or an abrasive planarization or polishing surface can be used instead or in combination with an abrasive processing composition.

A method of cleaning a substrate surface and processing equipment after processing a substrate surface with an abrasive material includes cleaning the substrate surface and processing equipment, such as a planarization surface, with the cleaning composition of the present invention. The substrate surface can be a semiconductor-based substrate surface, among many other possibilities.

DETAILED DESCRIPTION OF THE INVENTION

Figure 1:
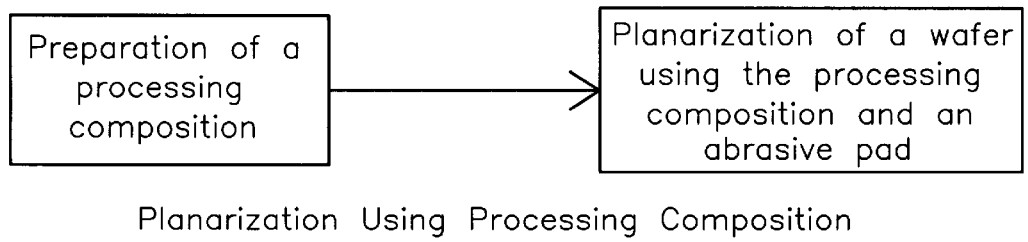
FIG. 1 illustrates a process flow for using a processing composition during the planarization of semiconductor-based substrates with an abrasive pad in accordance with the present invention.

The present invention is directed to methods of cleaning substrates and processing equipment, and in particular to cleaning substrates and planarization processing equipment both during and subsequent to processing, such as, for example, planarization of semiconductor-based substrate surfaces (i.e., surfaces of structures formed at least in part with a semiconductor material) or polishing of glass substrates, using a liquid composition including a quantity of an amide-containing compound, preferably an amido amine compound. It is to be understood that the term planarization as used herein is meant to encompass a wide variety of planarization techniques, as well known to one skilled in the art, whereby planarization is accomplished through mechanical abrasion of the substrate. Planarization can also encompass a chemically active component, such as in, for example, chemical mechanical planarization (CMP). Planarization and polishing processing are described generally herein as planarization, as both terms are meant to encompass mechanical abrasion of the substrate, even though polishing typically refers to less abrasion of the substrate than planarization.

It is also to be understood that the term substrate includes a wide variety of semiconductor-based structures and other substrates that can be contaminated by abrasive materials during processing. Substrate can be a single material, such as, for example, a silicon wafer. Substrate is also to be understood as including silicon-on-sapphire (SOS) technology, silicon-on-insulator (SOI) technology, doped and undoped semiconductors, epitaxial layers of silicon supported by a base semiconductor, as well as other semiconductor-based structures, including any number of layers as is well known to one skilled in the art. Furthermore, when reference is made to a substrate in the following description, previous process steps may have been utilized to form regions/junctions in a base semiconductor structure. The following detailed description is, therefore, not to be taken in a limiting sense, and the scope of the present invention is defined by the appended claims.

The liquid composition of the present invention is used to reduce the amount of, for example, metal and metalloid ion and abrasive particulate contaminants left on the substrate and planarization processing equipment as a result of the planarization process. By using the compositions and methods of the present invention, substrates and processing equipment can be cleaned effectively, removing contaminants such as abrasive particulates (e.g., silicon or aluminum oxides) and metal or metalloid ions, atoms, or molecules. For example, in semiconductor-based device fabrication, such methods and compositions enable higher yields to be realized in the fabrication of semiconductor-based integrated circuits due to the reduction in wafer losses due to excessive residual particulate contamination, which often degrades electrical performance of an integrated circuit. Furthermore, by using processing compositions of this invention, processing equipment can be cleaned in-situ, minimizing down time in the fabrication of integrated circuits.

The target contaminants of which the present invention is beneficial in removing, include, particularly, aluminum (Al) and silicon (Si) ions, atoms, or molecules, particularly oxides, as these are typically used in abrasive particles. Other contaminants include, for example, ions, atoms, molecules, or compounds of:

the alkali metals such as sodium (Na), potassium (K) and lithium (Li); alkaline earth metals such as magnesium (Mg) and calcium (Ca); and heavy metals such as iron (Fe), nickel (Ni), zinc (Zn), chromium (Cr), manganese (Mn), titanium (Ti), zirconium (Zr), and copper (Cu). The target abrasive particulates of which the present invention is particularly beneficial in removing include alumina, silica, and similar particulates.

The compositions of the present invention can function in a variety of ways. For example, the compositions can act by suspending or dissolving the contaminants through chelating or sequestering the contaminants. However, the purpose of compositions of the present invention is to remove contaminants from substrate and processing equipment surfaces whatever mechanism is involved. Therefore, the present invention is not limited to any particular mechanism.

The compositions include an amide-containing compound of the following formula (Formula I): $R^1$—C(O)—$NR^2$—$[(CR^3R^4)_x$—N—$R^5]_y$—$[C(O)]_z$—$R^6$, wherein each of $R^1$, $R^2$, $R^3$, $R^4$, $R^5$, and $R^6$ is independently H or an organic group, x=1–10, y=0–10, and z=0–1. Preferably, each of $R^1$, $R^2$, $R^3$, $R^4$, $R^5$, and $R^6$ is independently H or an organic group containing 1–30 carbon atoms, x=1–3, y=1–5, and z=0–1. More preferably, each of $R^1$, $R^2$, $R^3$, $R^4$, $R^5$, and $R^6$ is independently H or an organic group containing 1–20 carbon atoms. Most preferably, each of $R^1$ and $R^6$ is independently H or an organic group containing 10–20 carbon atoms and each of $R^2$, $R^3$, $R^4$, and $R^5$ is independently H or an organic group containing 1–5 carbon atoms.

As used herein, the term "organic group" means a hydrocarbon group that is classified as an aliphatic group, cyclic group, or combination of aliphatic and cyclic groups (e.g., alkaryl and aralkyl groups). In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

In compounds such as this, substitution is not only tolerated, but is often advisable. Thus, substitution is anticipated in the compounds used in the compositions of the present invention. As a means of simplifying the discussion and the recitation of certain terminology used throughout this application, the terms "group" and "moiety" are used to differentiate between chemical species that allow for substitution or that may be substituted and those that do not so allow or may not be so substituted. Thus, when the term "group" is used to describe a chemical substituent, the described chemical material includes the unsubstituted group and that group with nonperoxidic O, N, Si, or S atoms, for example, in the chain as well as carbonyl groups, carboxyl groups, or other conventional substitution. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

For the $R^1$ and $R^6$ groups in the compounds of Formula I, H and ($C_1$–$C_{30}$) organic groups are preferred, H and ($C_1$–$C_{20}$) organic groups are more preferred, and H and ($C_{10}$–$C_{20}$) organic groups are even more preferred. Of the organic groups, nonaromatic groups (e.g., aliphatic groups and alicyclic groups, which may or may not include unsaturation, and which may or may not include heteroatoms such as N, O, S, P, Si, etc.) are preferred. Of these, the aliphatic groups are more preferred, and alkyl moieties particularly long chain ($C_{10}$–$C_{20}$) alkyl moieties for $R^1$ and $R^6$) are most preferred. Thus, for particularly preferred compounds of Formula I, $R^1$ and $R^6$ can be H or a ($C_{10}$–$C_{20}$) alkyl moiety.

For the $R^2$, $R^3$, $R^4$ and $R^5$ groups in the compounds of Formula I, H and ($C_1$–$C_{30}$) organic groups are preferred, H and ($C_1$–$C_{20}$) organic groups are more preferred, H and ($C_1$–$C_{10}$) organic groups are even more preferred, and H and ($C_1$–$C_5$) organic groups are most preferred. Of the organic groups, nonaromatic groups (e.g., aliphatic groups and alicyclic groups, which may or may not include unsaturation, and which may or may not include heteroatoms such as N, O, S, P, Si, etc.) are preferred. Of these, the aliphatic groups are more preferred, and alkyl moieties are most preferred. Thus, for particularly preferred compounds of Formula I, $R^2$, $R^3$, $R^4$ and $R_5$ can be H or a ($C_1$–$C_5$) alkyl moiety.

Examples of compounds of Formula I include $CH_3(CH_2)_{14}C(O)N(H)(CH_2)_2N(H)(CH_2)_2NH_2$, $CH_3(CH_2)_{14}C(O)N(H)(CH_2)_2N(H)(CH_2)_2N(H)C(O)(CH_2)_{14}CH_3$, $CH_3(CH_2)_7CH=CH(CH_2)_7C(O)N(H)(CH_2)_2N(CH_2)_2N(C(O)(CH_2)_7CH=CH(CH_2)_7CH_3$, and $CH_3(CH_2)_4C(O)NH(CH_2)_2NH(CH_2)_2NH(CH_2)_2NH_2$. However, numerous possibilities exist for compounds of Formula I as defmed in the present invention. Such compounds are known and can be used to concentrate ores by flotation, as disclosed in U.S. Pat. No. 2,857,331 (Hollingsworth et al.).

The compounds of Formula I are typically prepared by the condensation of carboxylic acids, preferably fatty acids, with amines, preferably polyamines (including diamines, triamines, tetramines, etc.). The carboxylic acids have the general formula, RCOOH, wherein R is as defined above for $R^1$. The amine can be a mono-, di-, tri-, tetra-, etc. amine.

The $R^1$ group of Formula I is derived from the carboxylic acid, while $R^2$, $R^3$, $R^4$, and $R^5$ are derived from the amine. $R^6$ may be derived from the carboxylic acid or the amine depending on whether it is a 1:1 or 2:1 reaction product. An example of such a preparation method is the condensation of palmitic acid ($CH_3(CH_2)_{14}COOH$) with diethylene triamine ($H_2N(CH_2)_2N(H)(CH_2)_2NH_2$). The resultant condensation product can be different, depending on the ratio of the starting materials. That is, if the molar ratio of palmitic acid to diethylene triamine is 1:1, the product formed is $CH_3(CH_2)_{14}C(O)N(H)(CH_2)_2N(H)(CH_2)_2NH_2$, whereas if the molar ratio is 2:1, the product formed is $CH_3(CH_2)_{14}C(O)N(H)(CH_2)_2N(H)(CH_2)_2N(H)C(O)(CH_2)_{14}CH_3$. Note that the $R^1$ group in the product formed, $CH_3(CH_2)_{14}$, is derived from the palmitic acid. Other examples include the condensation of oleic acid ($CH_3(CH_2)_7CH=CH(CH_2)_7COOH$) with ethylene diamine ($H_2NCH_2CH_2NH_2$) and the condensation of stearic acid ($CH_3(CH_2)_{16}COOH$) with triethylene tetramine ($H_2N(CH_2)_2N(H)(CH_2)_2N(H)(CH_2)_2NH_2$), both of which can result in a 1:1 or a 2:1 (acid to amine) reaction product. The carboxylic acid starting materials include, for example, valeric, hexanoic, octanoic, decanoic, lauric, myristic, palmitic, stearic, glycolic, lactic, linoleic, linolenic, levulinic, oleic, and the like. The amine starting materials include, for example, ethylene diamine, diethylene triamine, triethylene tetramine, tetraethylene pentamine, and the like. Mixtures of various carboxylic acids and amines can be used as the starting materials to form multiple condensation products, or mixtures of condensed and noncondensed carboxylic acids and amines. For example, compositions of the present invention may include a mixture of a compound of Formula I, the parent carboxylic acid, and/or the parent amine.

The Formula I compounds are mixed with a suitable solvent or composition to form the processing/cleaning composition. Compositions of the present invention are typically aqueous based, although other solvents, such as, for example, organic solvents, can be used in place of, or in addition to, water. The compounds of Formula I may be used alone or in combination with other compounds of Formula I or with other components used in standard cleaning solutions or standard planarization slurries. For example, other compositions in which the Formula I compounds can be mixed include commercial cleaning solutions and any abrasive slurries or chemical components. In particular, the compositions of the present invention can be used in RODEL 2371 and RODEL XJFW8099 commercial planarization slurries. The compositions of the present invention can also be used in an SC-1 wet cleaning solution. The compositions of the present invention can also have other additives and surfactants added, examples of which are well known to one skilled in the art. For example, in addition to the amide-containing compound of Formula I, the compositions of the present invention can also include $NH_4OH$ and $H_2O_2$ when used in a SC-1 cleaning solution. The compositions of the present invention can also include silica and alumina particulates when used in planarization slurries.

The amount of compound of Formula I used in the processing/cleaning compositions of the present invention is an amount effective to reduce the concentration of, for example, metal and metalloid ions or other contaminants in liquid compositions and surfaces with which the liquid compositions are in contact. Concentrations of compounds of this invention can be up to about nearly 100% of the compositions in which they are used. Preferably, the compound of Formula I is present in the composition in an amount of less than about 50% by weight. More preferably, the compound of Formula I is present in the composition in an amount of about 5% to about 10% by weight.

Figure 2:
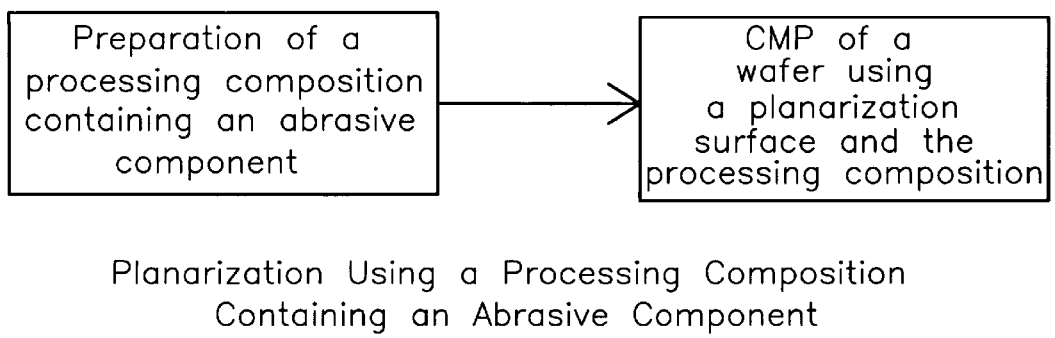
FIG. 2 illustrates a process flow for using an abrasive processing composition during the planarization of semiconductor-based substrates in accordance with the present invention.

As illustrated in FIG. 1 and FIG. 2, the liquid compositions of this invention are used in contact with, for example, planarization surfaces (i.e., abrasive pads, polishing surfaces, etc.), substrates, and other similar surfaces during processing such as planarization. When using processing compositions of the invention for cleaning planarization processing equipment, planarization equipment is cleaned during planarization processing. The compositions of the present invention can be used in a wide variety of planarization equipment. For example, they can be used in a Westech Model 372M wafer polisher, a Strasbaugh 6DS, or an ISOPLANAR 8000 by Cybeq Systems. When used during planarization, the processing compositions do not need to contain an abrasive component when an abrasive planarization surface, for example, an abrasive pad, is used during planarization, as described in FIG. 1.

However, as illustrated in FIG. 2, the processing composition can include an abrasive component, particularly when an abrasive planarization structure is not utilized during planarization. However, even when an abrasive planarization structure is utilized during planarization, abrasive particulates may break free of the planarization surface and become solvated in the processing composition. Thus, even when processing compositions are initially free of abrasive particulates, they may become abrasive processing compositions due to this mechanism.

Figure 3:
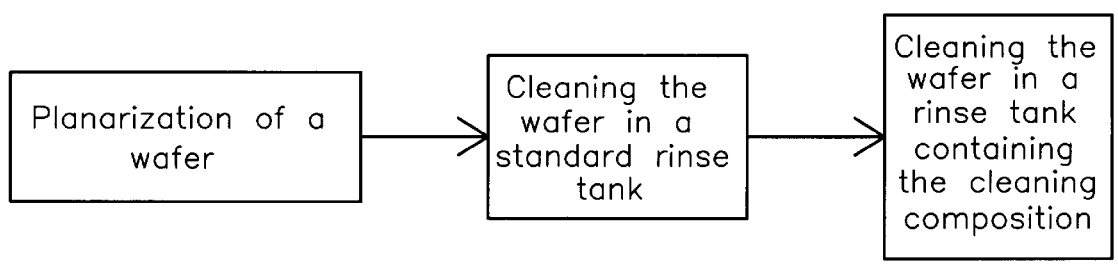
FIG. 3 illustrates a process flow for using a cleaning composition to clean semiconductor-based substrates subsequent to planarization in accordance with the present invention.

The compositions of the present invention can also be used as cleaning compositions in a wide variety of cleaning processes. For example, they can be used in ultrasonic or brush-cleaning systems. As illustrated in FIG. 3, the cleaning compositions of the present invention are useful for removing post-processing, for example, post-planarization, contamination from substrate surfaces. Compositions of the present invention can be used on substrates having junctions, isolation areas, steps, polysilicon lines, dielectrics, oxide-filled trenches, various metal films, doped oxides, spin on glasses, borophosphosilicate glass (BPSG), or any other such surface which may require processing, for example, planarization, and subsequent cleaning as is known to one skilled in the art.

Figure 4:
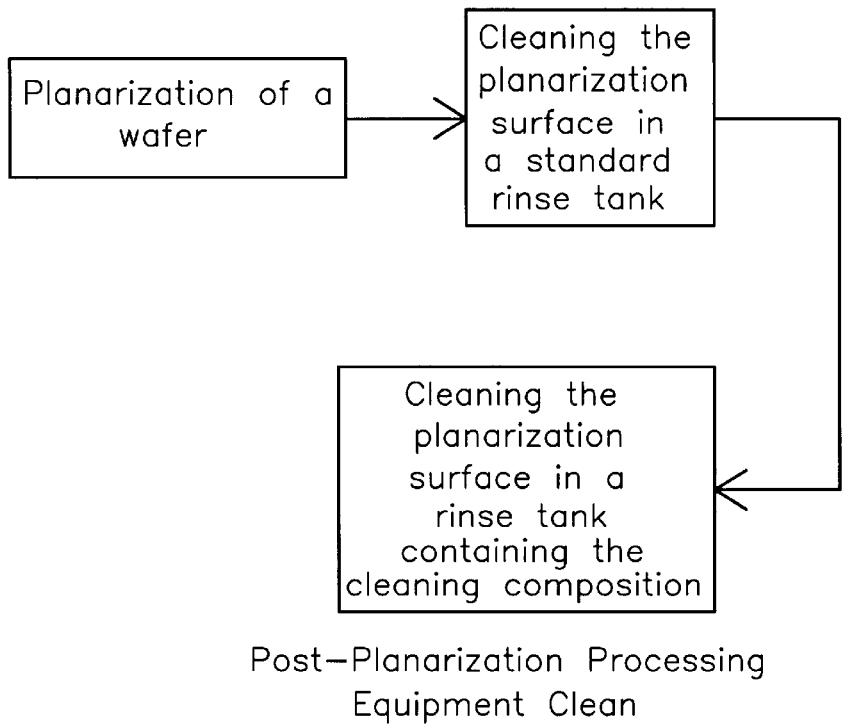
FIG. 4 illustrates a process flow for using the cleaning composition to clean planarization processing equipment in accordance with the present invention.

As illustrated in FIG. 4, the compositions of the present invention can also be used as cleaning compositions to clean planarization equipment after planarization processing. For example, polishing surfaces, abrasive pads, or any other such planarization surface that contacts a slurry or non-abrasive chemical component during planarization can be cleaned with the compositions of the present invention. Furthermore, the present invention is not limited to use with nonplanar surfaces. The present invention is also beneficial for use with substantially planar surfaces. Therefore, the present invention is not limited to the planarization or cleaning of any particular surface, but is limited only in accordance with the invention as described in the accompanying claims.

The following examples are offered to further illustrate the various specific and preferred embodiments and techniques. It should be understood, however, that many variations and modifications may be made while remaining within the scope of the present invention.

EXAMPLES

Example 1

Preparation of $CH_3(CH_2)_7(CH)_2(CH_2)_7C(O)N(H)(CH_2)_2NH(CH_2)_2N(H)C(O)(CH_2)_7 (CH)_2(CH)_7CH_3$ Oleic acid (50.0 g, 0.177 mol) is combined with diethylene triamine (9.13 g, 0.0885 mol). The mixture is heated to about 180° C., with stirring, for about 30 minutes. The product is then cooled and diluted with isopropyl alcohol to yield a 5% solution, by weight, of the amido-amine containing processing/cleaning composition.

Example 2

Preparation of $CH_3(CH_2)_4C(O)NH(CH_2)_2NH(CH_2)_2NH(CH_2)_2NH_2$

Hexanoic acid (30.0 g, 0.26 mol) and triethylene tetramine (38.0 g, 0.26 mol) are combined. The mixture is heated to about 120° C., with stirring, for about 30 minutes. The product is then cooled and diluted in 1 liter of isopropyl alcohol to yield a. 10% solution, by weight, of the amido-amine containing processing/cleaning composition.

Example 3

Use of N-(diethylenetriaminoethyl) hexanamide in a Post-Planarization Cleaning Composition N-(diethylenetriaminoethyl) hexanamide is prepared according to the method given above in Example 2. The solution is used in a post-planarization rinse tank. After planarization of BPSG, a substrate is passed through a 5 minute clean in $NH_4OH$ with megasonic processing to remove the bulk of particles remaining on the substrate. This is followed by a 10 second dip in dilute HF (i.e., a HF solution having a 1% concentration). This is followed by a brush scrub in a rinse tank containing N-(diethylenetriaminoethyl) hexanamide diluted in isopropyl alcohol to a concentration of 10% by weight.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. For example, while the description above focused on planarization of semiconductor-based substrates, the compositions and methods of the invention are also applicable to, for example, polishing glasses and contact lenses, as one of many other possible applications. The complete disclosures of all patents, patent documents, and publications listed herein are incorporated by reference, as if each were individually incorporated by reference.

What is claimed is:

1. A method of cleaning a semiconductor-based substrate, the method comprising:

providing a semiconductor-based substrate surface; and cleaning the semiconductor-based substrate surface with a cleaning composition, the cleaning composition comprising a compound of the formula:

(I) $R^1—C(O)—NR^2—[(CR^3R^4)_x—N—R^5]_y—[C(O)]_z,—R^6$, wherein each of $R^1$, $R^2$, $R^3$, and $R^6$ is independently H or a hydrocarbon moiety, x=1–10, Y=1–10, and z=0–1.

2. The method according to claim 1, wherein each of $R^1$, $R^2$, $R^3$, $R^4$, $R^5$, and $R^6$ is independently H or a hydrocarbon moiety containing 1–30 carbon atoms.

3. The method according to claim 2, wherein x=1–3 and y=1–5.

4. The method according to claim 1, wherein each of $R^1$ and $R^6$ is independently H or a hydrocarbon moiety containing 10–20 carbon atoms.

5. The method according to claim 1, wherein each of $R^2$, $R^3$, $R^4$ and $R^5$ is independently H or a hydrocarbon moiety containing 1–5 carbon atoms.

6. The method according to claim 1, wherein at least one of $R^1$, $R^2$, $R^3$, $R^4$, $R^5$, and $R^6$ is an alkyl moiety.

7. The method according to claim 1, wherein the cleaning composition further comprises at least one of a parent carboxylic acid or a parent amine.

8. The method according to claim 1, wherein the compound of Formula I is preparable by a condensation reaction of a carboxylic acid and an amine.

9. The method according to claim 1, wherein the compound of Formula I is present in the cleaning composition in an amount of less than about 50% by weight.

10. The method according to claim 9, wherein the compound of Formula I is present in the cleaning composition in an amount of less than about 10% by weight.

11. A method of planarizing a substrate, the method comprising:
providing a semiconductor-based substrate surface; and
planarizing the semiconductor-based substrate surface with a processing composition, the processing composition comprising a compound of the formula:
(I) $R^1-C(O)-NR^2-[(CR^3R^4)_x-N-R^5]_y-[C(O)]_z-R^6$, wherein each of $R^1$, $R^2$, $R^3$, $R^4$ and $R^6$ is independently H or an organic group, x=1–10, y=0–10, and z=0–1.

12. The method according to claim 11, wherein each of $R^1$, $R^2$, $R^3$, $R^4$, $R^5$, and $R^6$ is independently H or an organic group containing 1–30 carbon atoms.

13. The method according to claim 12, wherein x=1–3 and y=1–5.

14. The method according to claim 11, wherein each of $R^1$ and $R^6$ is independently H or an organic group containing 10–20 carbon atoms.

15. The method according to claim 11, wherein each of $R^2$, $R^3$, $R^4$, and $R^5$ is independently H or an organic group containing 1–5 carbon atoms.

16. The method according to claim 11, wherein at least one of $R^1$, $R^2$, $R^3$, $R^4$ $R^5$, and $R^6$ is an alkyl moiety.

17. The method according to claim 11, wherein the processing composition further comprises at least one of a parent carboxylic acid or a parent amine.

18. The method according to claim 11, wherein the compound of Formula I is preparable by a condensation reaction of a carboxylic acid and an amine.

19. The method according to claim 11, wherein the compound of Formula I is present in the processing composition in an amount of less than about 50% by weight.

20. The method according to claim 18, wherein the compound of Formula I is present in the processing composition in an amount of less than about 10% by weight.

21. The method according to claim 11, wherein the processing composition further comprises an abrasive component.

22. A method of cleaning processing equipment, the method comprising:
providing a planarization surface; and
cleaning the planarization surface with a composition, the composition comprising a compound of the formula:
(I) $R^1-C(O)-NR^2-[(CR^3R^4)_x-N-R^5]_y-[C(O)]_z-R^6$, wherein each of $R^1$, $R^2$, $R^3$, $R^4$, $R^5$, and $R^6$ is independently H or an organic group, x=1–10, y=0–10, and z=0–1, and wherein at least one of $R^1$, $R^2$, $R^3$, $R^4$, $R^5$, and $R^6$ is an alkyl moiety.

23. The method according to claim 22, wherein each of $R^1$, $R^2$, $R^3$, $R^4$, $R^5$, and $R^6$ is independently H or an organic group containing 1–30 carbon atoms.

24. The method according to claim 22, wherein x=1–3 and y=1–5.

25. The method according to claim 22, wherein each of $R^1$ and $R^6$ is independently H or an organic group containing 10–20 carbon atoms.

26. The method according to claim 22, wherein each of $R^2$, $R^3$, $R^4$, and $R^5$ is independently H or an organic group containing 1–5 carbon atoms.

27. The method according to claim 22, wherein the composition further comprises at least one of a parent carboxylic acid or a parent amine.

28. The method according to claim 22, wherein the compound of Formula I is preparable by a condensation reaction of a carboxylic acid and an amine.

29. The method according to claim 22, wherein the compound of Formula I is present in the composition in an amount of less than about 50% by weight.

30. The method according to claim 29, wherein the compound of Formula I is present in the composition in an amount of less than about 10% by weight.

31. The method according to claim 22, wherein the planarization surface is selected from the group consisting of an abrasive pad and a polishing pad.

32. A composition for use in fabricating semiconductor-based structures, the composition comprising a compound of the formula:
(I) $R^1-C(O)-NR^2-[(CR^3R^4)_x-N-R^5]_y-[C(O)]_z-R^6$, wherein each of $R^1$, $R^2$, $R^3$, $R^4$, $R^5$, and $R^6$ is independently H or an organic group, x=1–10, y=0–10, and z=0–1 wherein the composition is used for planarizing semiconductor-based substrate surfaces.

33. The composition of claim 32, wherein each of $R^1$, $R^2$, $R^3$, $R^4$, $R^5$, and $R^6$ is independently H or an organic group containing 1–30 carbon atoms.

34. The composition of claim 32, wherein x=1–3 and y=1–5.

35. The composition of claim 32, wherein at least one of $R^1$, $R^2$, $R^3$, $R^4$, $R^5$, and $R^6$ is an alkyl moiety.

36. The composition of claim 32, wherein each of $R^1$ and $R^6$ is independently H or an organic group containing 10–20 carbon atoms.

37. The composition of claim 32, wherein each of $R^2$, $R^3$, $R^4$, and $R^5$ is independently H or an organic group containing 1–5 carbon atoms.

38. The composition of claim 32, wherein the compound of Formula I is preparable by a condensation reaction of a carboxylic acid and an amine.

39. The composition of claim 32, wherein the compound of Formula I is present in the composition in an amount of less than about 50% by weight.

40. The composition of claim 32, wherein the compound of Formula I is present in the composition in an amount of less than about 10% by weight.

41. The composition of claim 32, further comprising an abrasive component.

42. A method of cleaning a substrate, the method comprising:
providing a semiconductor-based substrate surface; and
cleaning the semiconductor-based substrate surface with a cleaning composition, the cleaning composition comprising an amido-amine compound and at least one of a parent carboxylic acid or a parent amine.

43. A method of planarizing a substrate, the method comprising:
providing a semiconductor-based substrate surface; and
planarizing the semiconductor-based substrate surface with a processing composition, the processing composition, the processing composition comprising an amide-containing compound.

44. The method according to claim 43, wherein the amide-containing compound is an amido-amine compound.

45. A method of cleaning processing equipment, the method comprising:

providing a planarization surface wherein the planarization surface is selected from the group consisting of an abrasive pad and a polishing pad; and cleaning the planarization surface with a composition, the composition comprising a compound of the formula:

(I) $R^1—C(O)—NR^2—[(CR^3R^4)_x—N—R^5]_y—[C(O)]_z—R^6$, wherein each of $R^1, R^2, R^3, R^5$, and $R^6$ is independently H or an organic group, x=1–10, y=0–10, and z=0–1.

* * * * *

UNITED STATES PATENT AND TRADEMARK OFFICE
CERTIFICATE OF CORRECTION

PATENT NO. : 6,095,161
DATED : August 1, 2000
INVENTOR(S) : Vaartstra

It is certified that error appears in the above-identified patent and that said Letters Patent is hereby corrected as shown below:

Front Page, [22] Filed:, please delete "Jan. 17, 1996" and insert --Jan. 17, 1997--.

Column 3,
Line 53, please delete "defmed" and insert --defined--;

Column 5,
Line 51, please delete "$R_5$" and insert --$R^5$--;
Line 55, please delete
"=$CH(CH_2)_7C(O)N(H)(CH_2)_2N(CH_2)_2N(C(O)(CH_2)_7CH=CH(CH_2)_7CH_3$" and insert--
=$CH(CH_2)_7C(O)N(H)(CH_2)_2NH(CH_2)_2N(H)C(O)(CH_2)_7CH=CH(CH_2)_7CH_3$--;

Column 7,
Line 66, please delete
"$CH_3(CH_2)_7(CH)_2(CH_2)_7C(O)N(H)(CH_2)_2NH(CH_2)_2N(H)C(O)(CH_2)_7(CH)_2(CH)_7CH_3$"
and insert
--$CH_3(CH_2)_7(CH)_2(CH_2)_7C(O)N(H)(CH_2)_2NH(CH_2)_2N(H)C(O)(CH_2)_7(CH)_2(CH_2)_7CH_3$--;

Column 8,
Line 54, please delete "," following "$(O)]_z$";
Line 56, please delete "Y" and insert --y--.

Signed and Sealed this

Nineteenth Day of June, 2001

*Attest:*

NICHOLAS P. GODICI
*Attesting Officer*   Acting Director of the United States Patent and Trademark Office